(12) United States Patent
Nooruddin et al.

(10) Patent No.: US 10,435,996 B2
(45) Date of Patent: Oct. 8, 2019

(54) ESTIMATING MEASURES OF FORMATION FLOW CAPACITY AND PHASE MOBILITY FROM PRESSURE TRANSIENT DATA UNDER SEGREGATED OIL AND WATER FLOW CONDITIONS

(71) Applicant: Saudi Arabian Oil Company, Dhahran (SA)

(72) Inventors: Hasan A. Nooruddin, Dammam (SA); Noor M. Anisur Rahman, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 16/129,501

(22) Filed: Sep. 12, 2018

(65) Prior Publication Data

US 2019/0017353 A1 Jan. 17, 2019

Related U.S. Application Data

(62) Division of application No. 14/613,780, filed on Feb. 4, 2015, now Pat. No. 10,094,202.

(51) Int. Cl.
| | |
|---|---|
| *G01V 1/40* | (2006.01) |
| *E21B 41/00* | (2006.01) |
| *G06F 17/10* | (2006.01) |
| *G06F 17/50* | (2006.01) |
| *G01V 99/00* | (2009.01) |
| *E21B 49/00* | (2006.01) |

(52) U.S. Cl.
CPC ........ *E21B 41/0092* (2013.01); *E21B 49/008* (2013.01); *G01V 99/005* (2013.01); *G06F 17/10* (2013.01); *G06F 17/5009* (2013.01)

(58) Field of Classification Search
CPC .......................... E21B 41/0092; G01V 99/005
USPC ........................................................... 702/6
See application file for complete search history.

(56) References Cited

U.S. PATENT DOCUMENTS

| | | | |
|---|---|---|---|
| 3,246,145 A | 4/1966 | Higgins | |
| 3,784,828 A | 1/1974 | Hayes | |
| 3,892,128 A | 7/1975 | Smith, Jr. | |

(Continued)

FOREIGN PATENT DOCUMENTS

WO  2011019565 A2  2/2011

OTHER PUBLICATIONS

Al-Khalifa et al., "Multiphase Well Test Analysis: Pressure and Pressure-Squared Methods", SPE California Regional Meeting held in Bakersfield, California, 1989, pp. 581-590, SPE 18803.

(Continued)

*Primary Examiner* — Jay C Kim
(74) *Attorney, Agent, or Firm* — Bracewell LLP; Constance G. Rhebergen; Christopher L. Drymalla

(57) ABSTRACT

A segregated flow mechanism of oil and water usually takes place in the presence of strong gravity forces in subsurface environments, having specific geometrical and petrophysical properties undergoing simultaneous flow of multiphase fluids. The segregated flow of oil and water is modeled as a two-layer reservoir system, based on the observed data. Accurate estimates or measures of the values of phase mobility of oil and water, in addition to the actual flow capacity of the formation are provided. Reliable reservoir characterizations and reserve estimations are provided based on the in-situ conditions of oil and water in the reservoir.

11 Claims, 4 Drawing Sheets

(56) References Cited

U.S. PATENT DOCUMENTS

| | | |
|---|---|---|
| 3,905,226 A | 9/1975 | Nicolas |
| 4,028,546 A | 6/1977 | Peelman et al. |
| 4,173,718 A | 11/1979 | Fertl |
| 4,215,567 A | 8/1980 | Vlcek |
| 4,353,122 A | 10/1982 | Cubberly, Jr. |
| 4,475,591 A | 10/1984 | Cooke, Jr. |
| 4,799,157 A | 1/1989 | Kucuk et al. |
| 4,803,873 A | 2/1989 | Ehlig-Economides |
| 4,969,130 A | 11/1990 | Wason et al. |
| 5,031,467 A | 7/1991 | Rambow |
| 5,305,209 A | 4/1994 | Stein et al. |
| 5,509,474 A | 4/1996 | Cooke, Jr. |
| 5,548,563 A | 8/1996 | Slevinsky |
| 5,586,082 A | 12/1996 | Anderson et al. |
| 5,730,219 A | 3/1998 | Tubel et al. |
| 5,787,050 A | 7/1998 | Slevinsky |
| 5,803,167 A | 9/1998 | Bussear et al. |
| 5,829,520 A | 11/1998 | Johnson |
| 5,975,204 A | 11/1999 | Tubel et al. |
| 6,840,317 B2 | 1/2005 | Hirsch et al. |
| 6,898,986 B2 | 5/2005 | Daniel et al. |
| 6,980,940 B1 | 12/2005 | Gurpinar et al. |
| 7,089,167 B2 | 8/2006 | Poe |
| 7,240,568 B2 | 7/2007 | Atkinson |
| 7,293,471 B2 | 11/2007 | Lund Bo et al. |
| 7,369,979 B1 | 5/2008 | Spivey |
| 7,389,185 B2 | 6/2008 | Craig |
| 7,580,797 B2 | 8/2009 | Akram et al. |
| 7,708,086 B2 | 5/2010 | Witte |
| 7,774,140 B2 | 8/2010 | Craig |
| 8,065,923 B2 | 11/2011 | Duhanyan et al. |
| 8,244,509 B2 | 8/2012 | Banerjee et al. |
| 8,275,593 B2 | 9/2012 | Zhao |
| 8,437,997 B2 | 5/2013 | Meurer et al. |
| 8,473,268 B2 | 6/2013 | Benish et al. |
| 8,620,611 B2 | 12/2013 | Ong |
| 8,620,636 B2 | 12/2013 | Zhan et al. |
| 8,781,747 B2 | 7/2014 | Ziauddin |
| 8,793,110 B2 | 7/2014 | Myers et al. |
| 8,793,112 B2 | 7/2014 | Levitan |
| 9,068,872 B2 | 6/2015 | Gysling |
| 9,085,966 B2 | 7/2015 | Rahman |
| 9,261,869 B2 | 2/2016 | Cheng et al. |
| 9,367,653 B2 | 6/2016 | Madasu et al. |
| 9,417,970 B2 | 8/2016 | Fulton et al. |
| 9,513,241 B2 | 12/2016 | Whittaker |
| 9,569,521 B2 | 2/2017 | Crafton |
| 9,617,833 B2 | 4/2017 | Madasu et al. |
| 9,626,466 B2 | 4/2017 | Yang et al. |
| 2002/0043370 A1 | 4/2002 | Poe |
| 2002/0189337 A1 | 12/2002 | Maute |
| 2008/0210470 A1 | 9/2008 | Stewart |
| 2009/0126475 A1 | 5/2009 | Zhang et al. |
| 2009/0308601 A1 | 12/2009 | Poe, Jr. et al. |
| 2010/0082258 A1 | 4/2010 | Wang |
| 2010/0224361 A1 | 9/2010 | Pope et al. |
| 2011/0015909 A1 | 1/2011 | Zhao |
| 2011/0040536 A1 | 2/2011 | Levitan |
| 2011/0191029 A1 | 8/2011 | Jalali et al. |
| 2012/0018167 A1 | 1/2012 | Konopczynski et al. |
| 2012/0092690 A1 | 4/2012 | Saito |
| 2013/0080128 A1 | 3/2013 | Yang |
| 2013/0186688 A1 | 7/2013 | Rasmus et al. |
| 2013/0205886 A1 | 8/2013 | Hegeman et al. |
| 2013/0231867 A1 | 9/2013 | Lin et al. |
| 2013/0245952 A1 | 9/2013 | Lin et al. |
| 2013/0255940 A1 | 10/2013 | Rochford et al. |
| 2014/0083687 A1 | 3/2014 | Poe et al. |
| 2014/0257775 A1 | 9/2014 | Levitan |
| 2015/0233233 A1 | 8/2015 | Rahman |
| 2015/0276970 A1 | 10/2015 | Wu et al. |
| 2016/0061020 A1 | 3/2016 | Sayarpour |
| 2016/0177679 A1 | 6/2016 | Zhang et al. |
| 2016/0178799 A1 | 6/2016 | Sayarpour et al. |
| 2016/0201452 A1 | 7/2016 | Rahman et al. |
| 2016/0208599 A1 | 7/2016 | Rahman et al. |

OTHER PUBLICATIONS

Al-Mutairi et al., "Fully Integrated Approach Using Temperature Measurements to Describe Complex Reservoirs: Case Study from Saudi Arabia", SPE Annual Technical Conference and Exhibition held in New Orleans Louisiana, 2013, pp. 1-13, SPE 166159.

Anbarchi et al., "Determination of Front Locations in a Multilayer Composite Reservoir", The 64th Annual Technical Conference and Exhibition of the Society of Petroleum Engineers held in Texas, 1989, pp. 285-296, SPE19799.

Bakulin et al., "Acoustic signatures of crossflow behind casing in commingled reservoirs: A case study from Teapot Dome", Geophysics, 2008, pp. 145-152, vol. 73, No. 4, Society of Exploration Geophysicists.

Bourdet, D. "Chapter 1: Principles of Transient Testing" Well Test Analysis: The Use of Advanced Interpretation Models, 2002, pp. 1-23.

Bourdet, D. "Chapter 2: The Analysis Methods" Well Test Analysis: The Use of Advanced Interpretation Models, 2002, pp. 25-46.

Cheng-Tai, "Single-Phase Fluid Flow in a Stratified Porous Medium with Crossflow", Society of Petroleum of Engineers Journal, 1984, pp. 97-106, SPE of AIME.

Chu et al., "Pressure Transient Analysis of Two-Phase Flow Problems", SPE Formation Evaluation, 1986, pp. 151-164, Society of Petroleum Engineers.

International Search Report and Written Opinion for related PCT application PCT/US2015/015610 dated Jun. 29, 2015.

International Search Report and Written Opinion for related PCT application PCT/US2016/013147 dated Jul. 4, 2016.

International Search Report and Written Opinion for related PCT application PCT/US2016/014260 dated Jun. 13, 2016.

International Search Report and Written Opinion for related PCT application PCTUS2016/016330 dated Jun. 7, 2016.

Partial Search Report for related PCT application PCT/US2016/013147 dated Apr. 26, 2016.

Related U.S. Appl. No. 14/182,430, tiled Measuring Behind Casing Hydraulic Conductivity Between Reservoir Layers filed Feb. 18, 2014.

Related U.S. Appl. No. 14/595,299, tiled Measuring Inter-Reservoir Cross Flow Rate Between Adjacent Reservoir Layers From Transient Pressure Tests filed Jan. 13, 2015.

Related U.S. Appl. No. 14/601,769, tiled Measuring Inter-Reservoir Cross Flow Rate Through Unintended Leaks in Zonal Isolation Cement Sheaths in Offset Wells filed Jan. 21, 2015.

Ehlig-Economides et al., "A New Test for Determination of Individual Layer Properties in a Multilayered Reservoir", SPE Formation Evaluation, 1987, pp. 261-283, SPE14167.

Ehlig-Economides et al., "Vertical Interference Testing Across a Low-Permeability Zone", SPE Formation Evaluation, 1986, p. 1-18, Society of Petroleum Engineers.

Gao Chengtai, "The Crossflow Behavior and the determination of Reservoir Parameters by Drawdown Tests in Multilayer Reservoirs", Society of Petroleum Engineers, 1983, pp. 1-31, SPE 12580.

Gringarten, A. "From Straight Lines to Deconvolution: The Evolution of the State of the Art in Well Test Analysis" SPE 102079, 2006 SPE Annual Technical Conference & Exhibition, San Antonio, Texas, Sep. 24-27, 2006, pp. 41-62.

Kamal et al., "Pressure Transient Testing Under Multiphase Flow Conditions", SPE Middle East Oil and Gas Show and Conference held in Manama Bahrain, 2011, pp. 1-10, SPE 141572.

Kremenetskiy et al., "Well-Test Interpretation with Behind-the-Casing Crossflows", SPE Russian Oil & Gas Technical Conference and Exhibition held in Moscow Russia, 2008, pp. 1-12, Society of Petroleum Engineers.

Perrine, "Analysis of Pressure-buildup Curves", Presented at the spring meeting of the Pacific Coast District, Division of Production, 1956, pp. 482-509.

(56) References Cited

OTHER PUBLICATIONS

Rahman et al., "Profiling Pressure-Derivative Values-A New, Innovative Way to Estimate the Radii of Investigation in Heterogeneous Reservoir Systems", SPE Middle East Oil & Gas Show & Exhibition, Manama, Bahrain, Mar. 10-13, 2013, pp. 1-12, SPE164217.

Stehfest "Algorithms" Communications of the ACM, vol. 13, No. 1, Jan. 1970, pp. 47-54.

Stehfest, "Algorithms 368", Communications of the ACM, Jan. 1970, pp. 47-49. vol. 13, No. 1.

Zheng et al., "New Approaches for Analyzing Transient Pressure from Oil and Water Two-Phase Flowing Reservoir", 2009 Kuwait International Petroleum Conference and Exhibition, 2009, pp. 1-25, Society of Petroleum Engineers.

ESTIMATING MEASURES OF FORMATION FLOW CAPACITY AND PHASE MOBILITY FROM PRESSURE TRANSIENT DATA UNDER SEGREGATED OIL AND WATER FLOW CONDITIONS

PRIORITY

The present application is a divisional application of and claims priority to and the benefit of U.S. Non-Provisional application Ser. No. 14/613,780, filed Feb. 4, 2015, the entire disclosure of which is incorporated here by reference.

BACKGROUND OF THE INVENTION

1. Field of the Invention

The present invention relates to pressure transient testing of producing hydrocarbon (oil and gas) reservoirs, and more particularly to measuring formation flow capacity and phase mobility from pressure transient data under segregated oil and water flow conditions.

2. Description of the Related Art

Hydrocarbon reservoirs are typically considered to include those containing either oil, gas or both as recoverable hydrocarbons. A water phase coexists with hydrocarbons in almost all hydrocarbon reservoirs. Even when both oil and water coexist, these are nevertheless referred to as oil reservoirs. In a good oil reservoir, before any production of oil from the reservoir begins, an oil phase is the only mobile phase, while the water phase is at its residual saturation and is immobile.

As production continues, the water phase starts to break through towards the producing wells. As producing time progresses, the amount of water production rate increases, compared to the simultaneously declining oil production rate. The relative water-oil production rates are monitored at individual producing wells and quantified through a parameter known in the petroleum industry as "water cut ratio." A water cut ratio, normally expressed in percentage, is defined as the ratio of water production rate to the total production rate (oil and water together) at the surface conditions. Any prolonged production at a very high water cut ratio might lead to a decision to abandon this producing well, and to drill another supplementary well for oil production in a region of the field, uninvaded by water.

In the presence of strong gravity forces in subsurface environments, having specific geometrical and petrophysical properties undergoing simultaneous flow of multiphase fluids, segregated flow mechanism of oil and water usually takes place. Under this flow mechanism, the heavier fluid, water phase in this case, tends to position itself at the lower zone of the reservoir, while the lighter fluid, oil phase, positions itself at the upper zone of the reservoir. A difference in density between the oil and water phases is the main driving force in the process of segregating the oil and the water phases. This process is boosted by the low, creeping velocity of fluids in the reservoir. The segregated flow mechanism is observed very often in a number of fields known to Applicant, especially in giant carbonate formations, where good mobility in both the vertical and horizontal directions of the reservoir is present.

Pressure-transient tests can be viewed as experiments that are conducted on producing oil wells to acquire certain information about its productivity and to characterize the in-situ properties of its near-wellbore reservoir region. Properties derived from such tests, also known as well tests, are very important in evaluating the reservoir productivity and the accessibility to the hydrocarbon reserves, in addition to providing ability to understanding and characterizing reservoir rocks and its dynamic behavior under in-situ conditions.

In typical well test operations, pressure and production rates are measured as functions of time, usually using high-resolution gauges, located either at surface or downhole. The pressure and rate responses from the well tests are then analyzed and interpreted by identifying flow regimes using appropriate well and reservoir models. Analyses of the data obtained from well tests, called pressure-transient analyses, have become increasingly sophisticated with many numerical and analytical approaches. Analyses of data from tests under segregated flow of oil and water are not accurate, because the analysis equations are based on the assumptions of single-phase flow.

The most widely accepted methodology to-date to analyze multiphase flow is what is referred to as the Perrine method or approach (Perrine, R. L., 1956. Analysis of pressure-buildup curves. Drilling and Production Practice, API, 482-509). This approach does not consider rigorously the segregated flow mechanism as encountered in the oil reservoirs in the presence of water. As the Perrine method considers effective properties due to the reservoir and the fluids under multi-phase conditions, it does not have the capability of estimating the true formation capacity. Thus, the Perrine method provides limited information for reservoir characterization. Al-Khalifa et al. have shown with examples of the way the Perrine method is utilized in extracting the reservoir parameters (Al-Khalifa, A. J., Horne, R. N. and Aziz, K., 1989. Multiphase Well Test Analysis: Pressure and Pressure-Squared Methods. Paper SPE 18803 presented at the SPE California Regional Meeting, Bakersfield, Calif., April 5-7).

Further, as far as is known, previous efforts (mainly the Perrine method) in the prior art treat the multiphase flow systems the same way irrespective of the specific flow regime in hand. These prior methods do not distinguish the segregated flow mechanism from the other mechanisms. The Perrine method can only extract very limited information, related to the values of mobility in oil and water phases. It thus does not have the capability of determining the true formation capacity (or equivalent dry oil flow capacity). This method provides an accurate method of extracting flow capacity and phase mobility under segregated flow of oil and water.

SUMMARY OF THE INVENTION

Briefly, the present invention provides a new and improved computer implemented method of determining a measure of oil flow capacity from an oil production zone and water flow capacity from a water production zone as segregated flow in a layer of a subsurface reservoir based on a pressure transient test of the layer. Phase mobility values can be extracted readily from the corresponding flow capacity values. Formation flow parameters for the oil production zone and the water production zone are obtained. A test measure of well pressure is obtained during the pressure transient test of the layer containing both oil and water at sampled instants of measurement during the pressure transient test of the layer. From the measured well pressure, the corresponding pressure derivative at the original sampled instants of measured well pressure is calculated by utilizing the production rates. An estimated value of oil phase flow capacity of the oil production zone, and an estimated value of water phase flow capacity of the water production zone are determined. In addition, the equivalent oil phase flow capacity of the tested layer is also determined. A model of wellbore flowing pressure of the layer is determined based on the test measure of well pressure of the layer. A model oil production rate for the layer based on the model wellbore flowing pressure and the formation flow parameters; and a model water production rate for the layer based on the model wellbore flowing pressure and the formation flow parameters is determined. The model wellbore flowing pressure is compared with the test measure of well pressure; the model measure of well pressure change is compared with the test measure of well pressure change; and the model pressure derivative is compared with the test pressure derivative. If the model measures and test measures match within an acceptable tolerance, the determined formation flow parameters of the layer are stored. If not, the formation flow parameters of the layer are adjusted, and the steps of determining a model wellbore flow pressure, determining a model pressure derivative, and the steps of comparing are repeated based on the adjusted formation flow parameters of the layer.

The present invention further provides a new and improved data processing system for determining a measure of oil flow capacity from an oil production zone and water flow capacity from a water production zone as segregated flow in a layer of a subsurface reservoir based on a pressure transient test of the layer. The phase mobility values can also be extracted readily from the flow capacity values. The data processing system includes a processor which obtains formation flow parameters for the oil production zone and the water production zone, and also obtains a test measure of well pressure change during the pressure transient test of the layer. The processor also obtains a test measure of well pressure during the pressure transient test of the layer, and then a test pressure change and derivative of well pressure at sampled instants of measurement during the pressure transient test of the layer are calculated. The processor determines an estimated value of oil phase flow capacity of the oil production zone, and an estimated value of water phase flow capacity of the water production zone. The processor determines a model wellbore flowing pressure of the layer based on the test measure of well pressure of the layer. The processor determines a model oil production rate for the layer based on the model wellbore flowing pressure and the formation flow parameters, and a model water production rate for the layer based on the model wellbore flowing pressure and the formation flow parameters. The processor compares the model wellbore flowing pressure with the test measure of well pressure; the model measure of well pressure change with the test measure of well pressure change; and the model pressure derivative with the test pressure derivative. If the model measures and test measures match within an acceptable tolerance, the processor stores the determined formation flow parameters of the layer. If not, the processor adjusts the formation flow parameters of the layer, and repeats the steps of determining a model wellbore flow pressure, determining a model pressure derivative, and comparing based on the adjusted formation flow parameters of the layer.

The present invention further provides a new and improved data storage device which has stored in a non-transitory computer readable medium computer operable instructions for causing a data processing system to determine a measure of oil flow rate from an oil production zone and water flow rate from a water production zone as segregated flow in a layer of a subsurface reservoir based on a pressure transient test of the layer. The instructions stored in the data storage device causing the data processing system to perform steps of obtaining formation flow parameters for the oil production zone and the water production zone, and obtaining a test measure of well pressure during the pressure transient test of the layer. The instructions also cause the data processing system to perform steps of calculating a test measure of well pressure during the pressure transient test of the layer, and calculating a test pressure derivative of well pressure at sampled instants of measurement during the pressure transient test of the layer. The instructions cause the data processing system to determine an estimated value of oil phase flow capacity of the oil production zone, and an estimated value of water phase flow capacity of the water production zone and the equivalent oil phase flow capacity of the tested layer. The corresponding mobility from the calculated flow capacity is readily obtained by dividing the flow capacity by the corresponding pay thickness and the fluid viscosity. The instructions also cause the data processing system to determine a model wellbore flowing pressure of the layer based on the test measure of well pressure of the layer, determine a model oil production rate for the layer based on the model wellbore flowing pressure and the formation flow parameters, and determine a model water production rate for the layer based on the model wellbore flowing pressure and the formation flow parameters. The instructions cause the data processing system to compare the model wellbore flowing pressure with the test measure of well pressure, compare the model measure of well pressure change with the test measure of well pressure change, and compare the model pressure derivative with the test pressure derivative. If the model pressure measures and test pressure measures match within an acceptable tolerance, the instructions cause the data processing system to store the determined formation flow parameters of the layer with the formation and phase flow capacity values. If not, the instructions cause the data processing system to adjust the formation flow parameters of the layer, and repeat the steps of determining a model wellbore flow pressure, determining a model pressure derivative, and comparing based on the adjusted formation flow parameters of the layer.

DETAILED DESCRIPTION OF THE PREFERRED EMBODIMENTS

Figure 1:
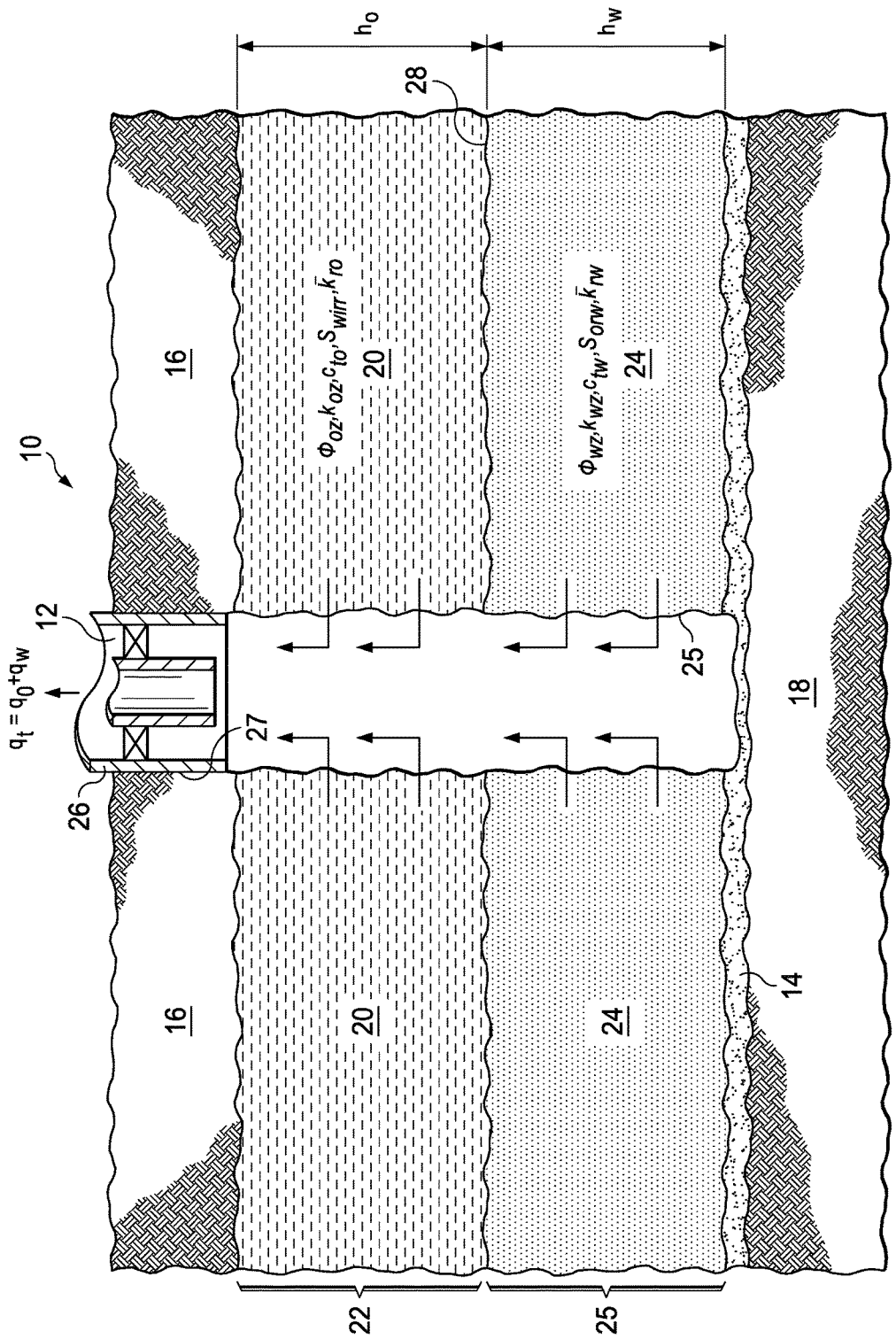
FIG. 1 is a schematic view, taken in cross-section, of a producing well in the earth with segregated flow of oil and water phases from a formation layer.

In the drawings, FIG. 1 represents schematically a cross-sectional view of a subsurface reservoir R into which a vertical hydrocarbon producing well 10 in a wellbore 12 which has been drilled extending into a porous subsurface formation producing layer 14 between two impermeable rock layers 16 and 18. As shown in FIG. 1 at 20, an oil phase is present in an oil zone 22 of height $h_o$ in the porous producing layer 14, and a water phase 24 is present in a water zone 25 of height $h_w$ in layer 14. The well 10 is completed in the layer 14 at a sandface 27 with a casing string 26.

From well-log measurements, it is possible to confirm the location of a sharp interface 28 between the oil phase 20 and the water phase 24 in the reservoir layer 14. During segregated flow, above the interface 28, only the oil phase 20 is mobile, while the water phase is present in irreducible water saturation which is immobile. In contrast, below the interface 28, only the water phase 24 moves, while the oil phase is trapped in residual oil saturation and stays immobile. Only the mobile fluid in a particular zone contributes to the production through the wellbore, and the immobile fluid in that zone stays in the reservoir. The segregated flow of oil and water is governed by certain dynamic parameters of the formation (e.g., relative permeability, absolute values of vertical and horizontal permeability), petrophysical parameters (e.g., porosity, oil and water zone thicknesses), and certain characteristics parameters related to the fluids in place (e.g., density deference and average fluid velocity).

Understanding the fundamentals of multiphase flow and the underlying mechanism is essential in proper management of oil fields. Among the very few multiphase flow mechanisms encountered at reservoir conditions, segregated flow of oil and water phases is the most frequent one. Segregated flow takes place primarily as a result of the density difference between the oil and water phases. Generally, fluid flows through porous media at relatively low velocity permitting gravity to force fluids to segregate from each other, where heavier fluids (e.g., water) slump down to the base of the reservoir and lighter fluids (e.g., oil) rise up. The segregated flow mechanism is commonly observed in most oil fields and can be identified by having a sharp interface between the oil and water phases.

Sharp interfaces such as shown schematically at 28 between oil and water in partially-flooded (with water) regions are repeatedly observed from well-logs and other types of measurements in most giant oil fields known to Applicant. Many pressure-transient tests are run in wells having significant water productions. Analyzing pressure-transient data under segregated flow conditions using conventional multiphase flow methods that are currently employed in the industry is not adequate and could result in inaccurate values of the formation flow capacity and the individual phase mobility.

To overcome this shortcoming, the present invention provides a methodology of analyzing and determining measures the segregated flow of oil and water as a two-layer reservoir system as shown in FIG. 1. As such, the segregated flow parameters can be derived analytically. Having honored the in-situ physics, the present invention provides better estimates of the formation flow capacity and the oil and water phase mobility. As has been mentioned, so far as is known, current approaches to analysis of well test data under segregated flow conditions of oil and water are inadequate in capturing the underlying physics.

Under conditions of multiphase flow, the oil and water phases 20 and 24 approach the vertical well 10 separately. The oil phase 20 is produced separately from a clear, distinguished oil zone 22 of layer 14 with distinct static and dynamic flow related properties as shown in FIG. 1 (e.g., thickness $h_o$, permeability $k_{oz}$, porosity $\phi_{oz}$, total compressibility $c_{to}$, residual water saturation $S_{wirr}$ and relative permeability of oil $\overline{k}_{ro}$ at residual water saturation). Similarly, the water phase 24 is produced from a well-defined water zone 26 located at the bottom of the reservoir layer 14, having distinct static and dynamic flow related properties (e.g., thickness $h_w$, permeability $k_{wz}$ porosity $\phi_{wz}$, total compressibility $c_{tw}$, residual oil saturation $S_{orw}$ and relative permeability of water $\overline{k}_{rw}$ at residual oil saturation). Each of zones 22 and 26 thus has its own properties as porosity, permeability, total compressibility and residual saturation fractions. After leaving the sandface 25 of the well to be produced, the oil and water are mixed in the wellbore 12 as the phases travel towards the wellhead at surface. The mixture is produced and measured at surface and the water cut ratio, or fraction of water in the total mixture is determined.

The present invention provides measures of the formation flow capacity and phase mobility of the two distinct layers of oil and water around a vertical producing well, as shown in in FIG. 1. The distinctness of the layers is dealt with through letting the reservoir and fluid properties in each layer be allowed to have its own distinct values for the sake of generality. Production logs and well tests are popular tools in the oil fields to recognize such segregated conditions. The present invention treats the problem as a two-layer reservoir system with no crossflow of oil and water between the layers. The analytical solution provided with the present invention considers a constant value to the total rate of production of oil and water during the production (or drawdown) period of the pressure-transient test. The present invention is applicable to those reservoirs where both oil and water phases are present, but no free gas phase is available at reservoir conditions.

Set forth below are nomenclature and working equations according to the methodology of the analytical solution, also interchangeably referred to as the model, which is provided with the present invention to characterize the formation flow capacity and the values of multiphase mobility under segregated flow conditions.

Nomenclature

C Wellbore storage constant, bbl/psi
$c_o$, $c_w$ Compressibility of oil and water phases, respectively, $psi^{-1}$
$c_r$ Formation compressibility, $psi^{-1}$
$c_{to}$, $c_{tw}$ Total compressibility in oil and water zones, respectively, $psi^{-1}$
$f_w$ Fractional flow of water, fraction
H Total reservoir thickness of oil and water layers, ($h_o+h_w$), ft
$h_o$, $h_w$ Thicknesses of the oil and water zones, respectively, ft $k_{oz}$, $k_{wz}$ Absolute permeability in oil and water zones, respectively, and $\bar{k}_{ro}$ Relative permeability of oil at irreducible water saturations, fraction $\bar{k}_{rw}$ Relative permeability of water at residual oil saturations, fraction $K_0(\ )$, $K_1(\ )$ Modified Bessel function of the second kind of orders 0 and 1, respectively l Laplace transform parameter, $hr^{-1}$ $p_i$ Initial reservoir pressure, psia $\bar{p}_{wf}$ Flowing bottom-hole pressure in Laplace domain, psia-hr $q_o$ Oil production rate at surface conditions, STB/d $q_t$ Total liquid production rate at reservoir conditions, bbl/d $q_w$ Water production rate at surface conditions, STB/d $\overline{q_o B_o}$ Oil production rate at reservoir conditions in Laplace domain, bbl-hr/d $\overline{q_w B_w}$ Water production rate at reservoir conditions in Laplace domain, bbl-hr/d $r_w$ Physical wellbore radius, ft $\ddot{r}_{w_o}$ Equivalent wellbore radius in oil zone calculated using Equation 14, ft $\ddot{r}_{w_y}$ Equivalent wellbore radius in water zone calculated using Equation 15, ft $S_{orw}$ Residual oil saturation in the water zone, fraction $s_o$, $s_w$ Skin factors in oil and water zones, respectively, dimensionless $S_{wirr}$ Irreducible water saturation in the oil zone, fraction t Elapsed time, hr $\sigma_o$, $\sigma_w$ Parameters calculated using Equations 6 and 7 for oil and water phases, respectively, $$\left(\frac{cP}{md - psia - hr}\right)^{1/2}$$

$\eta_o$, $\eta_w$ Diffusivity parameters for oil and water zones calculated using Equations 8 and 9, respectively, md-psia-$P^{-1}$ $\xi_o$, $\xi_w$ Parameters calculated using Equations 10 and 11 for oil and water phases, respectively, $$ft^2 - \left(\frac{md}{psia - hr - cP}\right)^{1/2}$$

$\phi_{oz}$, $\phi_{wz}$ Porosity in oil and water zones, respectively, fraction $\mu_o$, $\mu_w$ Viscosity of oil and water phases, respectively, cP Once the oil and water phases leave the sandface 25 and enter the borehole through the completed interval(s), the flowing bottom-hole pressures of both phases are considered for the purposes of the present invention to be equal at any given depth inside the wellbore 12 due to a minor difference in hydrostatic pressure at the respective mid-point of oil and water layers. In normal practice, flowing bottom-hole pressure is measured at a depth inside the wellbore, where the gauges are located, which are later corrected to a datum depth. Thus, at the gauge depth, oil and water phase pressures are considered identical. This condition can be expressed mathematically as a function of time as follows:

$$p_{wf}(r_w,t) = p_w(\ddot{r}_{w_w},t) = p_o(\ddot{r}_{w_o},t) \quad (1)$$

where $p_{wf}$ is the flowing bottom-hole pressure of the mixture of oil and water in psia, $p_w$ is the flowing bottom-hole pressure of the water phase alone in psia, $p_o$ is the flowing bottom-hole pressure of the oil phase in psia, t is the time in hr, $r_w$ is the actual wellbore radius, $\ddot{r}_{w_w}$ is the effective wellbore radius in ft in the water zone and $\ddot{r}_{w_o}$ is the effective wellbore radius in ft in the oil zone. In the presence of skin factors, the physical wellbore radii are corrected for the effective wellbore radii.

Equation (1) states that the bottom-hole flowing pressure at any given time equals the pressure of the water phase 24 just leaving the water zone 26 and the pressure of the oil phase 20 just leaving the oil zone 22 at a particular time. In other words, the oil and water pressures are evaluated at the sandface since the pressure of the mixture at any point in a cross section of the wellbore is considered identical for all practical purposes. The effective wellbore radius, as will be defined with equations later, is used to account for the skin effects at the oil and water zones 22 and 26. For generalization purposes, the model provided according to the present invention can handle different skin factors at each of the separate zones of oil and water, although, this might be difficult to confirm such cases in reality.

Since the formulation is based on a constant total production rate, $q_t$, the flowing wellbore pressure, $p_{wf}$, changes as a function of time. In the mathematical model, the total production rate, $q_t$, at the reservoir conditions, is considered constant, while individual phase rates, $q_o$ and $q_w$, are allowed to change with time. The flow rate model with the rates at reservoir conditions is expressed as:

$$q_t = q_o(t)B_o + q_w(t)B_w \quad (2)$$

In Equation 2, $q_t$ is at reservoir conditions in bbl/d, while $q_o$ and $q_w$ are at standard conditions in STB/d. The oil and water formation volume factors, $B_o$ and $B_w$, which are used to convert oil and water production rates from surface conditions to reservoir conditions as both $B_o$ and $B_w$ have the units of bbl/STB.

Presentation of the Model

The equations expressing the physical relationships of segregated oil and flow are expressed below. The model is based on the derived from the analytical solution of the known diffusivity equation that describes pressure as a continuous function of space and time in porous media. All equations are presented in the system of US Oilfield units. Conversions to any other system of units may be readily performed and is contemplated with the present invention.

The effects of wellbore storage and skin are included through the use of wellbore storage constant, C, in bbl/psi, and the effective wellbore radius, respectively, as indicated previously. All pressures, including those in the oil and water zones, are in psia and are corrected to a datum depth.

The model permits determination of the flowing bottom-hole pressure. Individual phase rates (oil and water) are also determined with the model to verify the input phase rates and to optimize the input parameters, as may be needed later on. As was previously indicated, the model considers producing at a constant total production rate, while the pressures, the pressure derivatives and the oil and water production rates are calculated as a function of time.

The time-dependent quantities (pressure, pressure derivative and individual phase rates) are presented in the Laplace domain because the original partial differential equations are solvable in this domain. The parameters that are calculated in the Laplace domain are presented with a bar on top of them (e.g. $\bar{p}_{wf}$, $\overline{q_o B_o}$, and $\overline{q_w B_w}$). An inversion to the real time domain is required to obtain the desired solution. This step can be achieved numerically using what is called the Stehfest algorithm [Stehfest, H., 1970, Algorithm 368: Numerical Inversion of Laplace Transforms. Communications of ACM 13(1):47-49]. The Nomenclature section set forth above provides definitions for the symbols used in the equations.

Flowing Bottom-Hole Pressure:

$$\bar{p}_{wf}(l) = \frac{p_i}{l} - \frac{q_t K_0(\sigma_w \bar{r}_{w_w}) K_0(\sigma_o \bar{r}_{w_o})}{l \begin{bmatrix} \xi_o K_1(\sigma_o r_w) K_0(\sigma_w \bar{r}_{w_w}) + \xi_w K_1(\sigma_w r_w) K_0(\sigma_o \bar{r}_{w_o}) + \\ 24 C l K_0(\sigma_w \bar{r}_{w_w}) K_0(\sigma_o \bar{r}_{w_o}) \end{bmatrix}} \quad (3)$$

Oil Production Rate:

$$\overline{q_o B_o}(l) = \frac{\xi_o q_t K_1(\sigma_o r_w) K_0(\sigma_w \bar{r}_{w_w})}{l \begin{bmatrix} \xi_o K_1(\sigma_o r_w) K_0(\sigma_w \bar{r}_{w_w}) + \xi_w K_1(\sigma_w r_w) K_0(\sigma_o \bar{r}_{w_o}) + \\ 24 C l K_0(\sigma_w \bar{r}_{w_w}) K_0(\sigma_o \bar{r}_{w_o}) \end{bmatrix}} \quad (4)$$

Water Production Rate:

$$\overline{q_w B_w}(l) = \frac{\xi_w q_t K_1(\sigma_w r_w) K_0(\sigma_o \bar{r}_{w_o})}{l \begin{bmatrix} \xi_o K_1(\sigma_o r_w) K_0(\sigma_w \bar{r}_{w_w}) + \xi_w K_1(\sigma_w r_w) K_0(\sigma_o \bar{r}_{w_o}) + \\ 24 C l K_0(\sigma_w \bar{r}_{w_w}) K_0(\sigma_o \bar{r}_{w_o}) \end{bmatrix}} \quad (4)$$

Parameters Requiring Pre-Calculation for Equation 3, 4 and 5:

$$\sigma_o = \sqrt{l/\eta_o} \quad (6)$$

$$\sigma_w = \sqrt{l/\eta_w} \quad (7)$$

$$\eta_o = \frac{0.0002637 k_{oz} \bar{k}_{ro}}{\phi_{oz} \mu_o c_{to}} \quad (8)$$

$$\eta_w = \frac{0.0002637 k_{wz} \bar{k}_{rw}}{\phi_{wz} \mu_w c_{tw}} \quad (9)$$

$$\xi_o = \frac{k_{oz} \bar{k}_{ro} h_o \sigma_o r_w}{141.2 \mu_o} \quad (10)$$

$$\xi_w = \frac{k_{wz} \bar{k}_{rw} h_w \sigma_w r_w}{141.2 \mu_w} \quad (11)$$

$$c_{to} = c_r + (1 - S_{wirr}) c_o + S_{wirr} c_w \quad (12)$$

$$c_{tw} = c_r + (1 - S_{orw}) c_w + S_{orw} c_o \quad (13)$$

$$\bar{r}_{w_o} = r_w \exp(-s_o) \quad (14)$$

$$\bar{r}_{w_w} = r_w \exp(-s_w) \quad (15)$$

Figure 2:
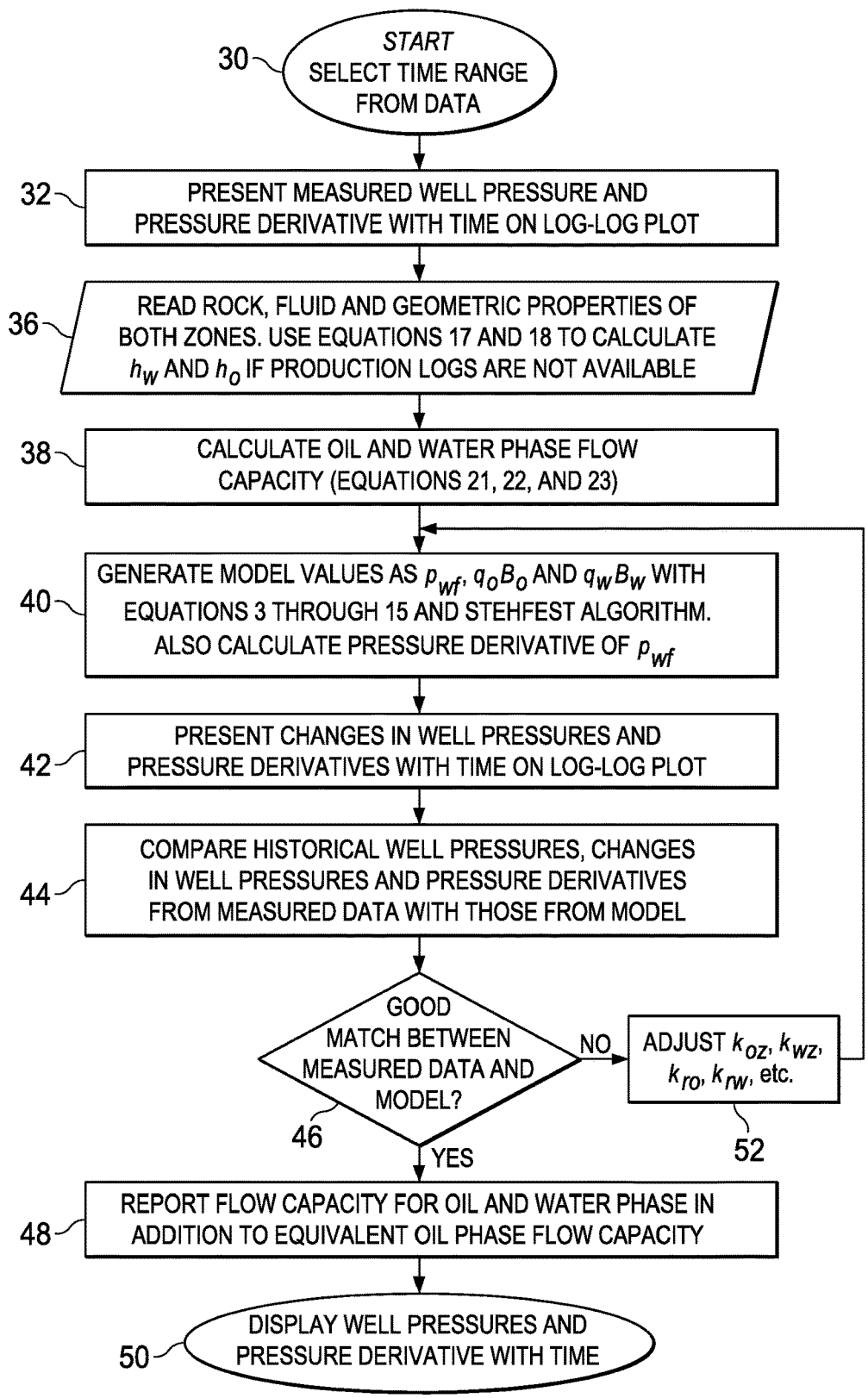
FIG. 2 is a functional block diagram of a flow chart of data processing steps for obtaining estimated measures of formation flow capacity and phase mobility according to the present invention.

As mentioned earlier, the solution presented with Equations (3), (4), and (5) has been expressed in the Laplace domain, and an inversion of to the actual time domain is required at step 40 in FIG. 2. This inversion is done numerically using the Stehfest algorithm (1970). A person skilled in the art can readily perform such an inversion without difficulty.

The calculation of pressure derivative $$\left( t \frac{dp_{wf}}{dt} \right)$$

is done simultaneously with the calculation of $p_{wf}$ before applying the Stehfest algorithm at step 40 in FIG. 2. Equations (4) and (5) are used mainly to validate the individual phase rates input to the model. The formulation is for unbounded, infinite-acting reservoirs. Average fluid saturations in the drainage area are assumed to be fixed during the test period. In addition, no crossflow of oil and water between the two adjacent layers occurs, and capillary pressure (pressure difference between the oil and water phases inside the porous media due to interfacial tension) at the boundary between the oil and water phases is ignored.

In order to make use of Equation (3) in determining $\bar{p}_{wf}$, the thicknesses of the oil, $h_o$, and the water, $h_w$, zones must be available beforehand. Hence this matter is related to step 36 in FIG. 2. In presence of valid production logs, such information can be estimated with a reasonable accuracy. In most cases, however, production logs may not be available, and only total reservoir thickness, H, is available from the formation analysis logs. Under these circumstances, the steps described to this point are used to extract the oil water zone thicknesses. Fortunately, under segregated flow conditions the thickness of the oil and water zones can be estimated from the definition of fractional flow of water, $f_w$, utilizing the individual phase production rates, fluid properties and some petrophysical parameters of each zone. Thus, one may use this alternative route in estimating the thicknesses of the oil and water zones when the production logs are not available. This is illustrated below through Equations (16) through (18), starting with the definition of fractional flow of water under reservoir conditions as:

$$f_w = \frac{q_w B_w}{q_w B_w + q_o B_o} \quad (16)$$

Assuming steady-state multiphase flow conditions, the thicknesses of the oil and water phases, $h_w$, and $h_o$, can be calculated, using the following mathematical expressions, respectively, $$h_w = \frac{H}{\frac{k_{wz} \bar{k}_{rw} \mu_o}{k_{oz} \bar{k}_{ro} \mu_w} \left( \frac{1}{f_w} - 1 \right) + 1} \quad (17)$$

$$h_o = H - h_w \quad (18)$$

Similarly, average water and oil saturation fractions in the tested zones can be estimated, using the following mathematical expressions, respectively:

$$S_w = \frac{\phi_{wz} h_w (1 - S_{orw}) + \phi_{oz} h_o S_{wirr}}{\phi_{wz} h_w + \phi_{oz} h_o} \quad (19)$$

$$S_o = \frac{\phi_{oz} h_o (1 - S_{wirr}) + \phi_{wz} h_w S_{orw}}{\phi_{wz} h_w + \phi_{oz} h_o} \quad (20)$$

A complete process of implementation of this invention with the generated model results, utilizing the above equations, is presented in FIG. 2. The purpose of having the model results is to generate model reservoir responses to compare with those captured from actual well tests. Efforts are made to extract reasonable reservoir parameters, including wellbore storage constant and skin factor, for which there is a good match between the test data and the model results. As will be described below, comparisons are made between test data and determined model values. Once a satisfactory match is obtained between the model values and the measured pressure-transient data, the flow capacity for oil and water phases and the equivalent oil phase (assuming producing at dry-oil conditions) are calculated as:

Flow capacity for oil phase=$k_{oz}\bar{k}_{ro}h_o$ (21)

Flow capacity for water phase=$k_{wz}\bar{k}_{rw}h_w$ (22)

Equivalent oil phase flow capacity=$\bar{k}_{ro}(k_{oz}h_o+k_{wz}h_w)$ (23)

A computer implemented process according to the present invention of determining measures of formation flow capacity and phase mobility. Individual phase mobility is obtained by dividing the phase flow capacity by the zone thickness and by the phase viscosity. As this step is straightforward, extracting the phase flow capacity is important with the present invention. Under segregated oil and water flow conditions, for pressure transient-test data, an iterative scheme is illustrated schematically in a flow chart F in FIG. 2.

The flow chart F (FIG. 2) illustrates the structure of the logic of the present invention as embodied in computer program software. Those skilled in the art will appreciate that the flow charts illustrate the structures of computer program code elements including logic circuits on an integrated circuit that function according to this invention. Manifestly, the invention is practiced in its essential embodiment by a machine component that renders the program code elements in a form that instructs a digital processing apparatus (that is, a computer) to perform a sequence of data transformation or processing steps corresponding to those shown.

As shown at step 30, processing according to the present invention begins with a time range being selected from the pressure and time data obtained during pressure transient test of a layer of interest such as porous subsurface formation producing layer 14 (FIG. 1). The model and its structure have been described above in terms of equations in the Laplace domain. During step 32 in FIG. 2, the measured well pressure $p_{wf}$ and pressure derivative $$\left(t\frac{dp_{wf}}{dt}\right)$$

are formatted in a form for storage and subsequent display in log-log plots, and are available for output display by data processing system D (FIG. 4) in such format.

During step 36 (FIG. 1), relevant petrophysical, reservoir and for both oil and water zones 22 and 26, together with the properties of the fluids-in-place are gathered. Information, such as porosity and overall net pay thickness, can be extracted from the interpretation of open-hole logs. Residual fluid saturations and relative permeability end-points can be determined from core analyses and laboratory reports on representative rock samples. Individual zone thicknesses can be estimated from production logs, open-hole logs, and/or production data. In the absence of such logs, the alternative method described above with Equations (16), (17) and (18) may be used during step 36 to estimate the zone thicknesses $h_o$ and $h_w$. Formation volume factor, viscosity and other fluid properties can be determined from fluid properties reports and correlations.

During step 38 an initial measure or estimate is made of the oil and water phase flow and the equivalent oil phase d according to Equations (21), (22) and (23) above.

During step 40, model values of well flowing pressure ($p_{wf}$), and oil flow rate ($q_oB_o$) and water flow rate ($q_wB_w$) are determined using the methodology described with Equations (3) through (15) and the Stehfest algorithm mentioned above. The pressure derivative $$\left(t\frac{dp_{wf}}{dt}\right)$$

of the model well pressure $p_{wf}$ and the change in model well pressure are also determined during step 40 in the manner described above. The respective change in pressure and derivative (log-log) plots are made ready to compare with the actual pressure and derivative of data from actual transient tests. The data values determined during step 40 are formatted in a form for storage and subsequent display in log-log plots, and are available in that format for output display as indicated at step 42 by data processing system D.

During step 44, the model values of well pressure $p_{wf}$, change in pressure and the corresponding pressure derivative $$\left(t\frac{dp_{wf}}{dt}\right),$$

determined during step 40, are compared visually or graphically to the corresponding measured values, obtained during step 32. The working equations for the model have been presented above.

Thus, during step 44 the model well pressure change and the corresponding pressure derivative $$\left(t\frac{dp_{wf}}{dt}\right)$$

responses are compared visually or graphically with the corresponding measured data on a log-log plot. Graphical or visual comparisons are required for each of well pressure, pressure changes (drawdowns) and pressure derivative during step 44. It is required to compare the pressure values in the same way. The model has been presented earlier in terms of equations in the Laplace domain. Thus, the determined model results of step 40 are compared to the corresponding test measured values in step 44. If as indicated by step 46 the model values of pressure obtained during step 40, which are also compared visually or graphically during step 44, indicate that the model values of pressure being compared correspond within a specified acceptable tolerance of the measured values of test pressure, the model built with the formation flow parameters of the layer is acceptable. Thus, step 46 is a quantitative comparison between the model pressure values and the measured pressure values. It is a common practice in the industry to leave out the criteria of selecting the closeness between the measured and the model values with the analyst. Such a process involves minimizing the standard deviation between the measured pressures and the model pressures to a preset tolerance (for example, 0.1 psia). As the tolerance value is preset to a lower value, the computational burden increases. Once such a preset tolerance is satisfied in step 46, people skilled in the art will be pleased to call the model as the reasonably well matched one.

Figure 4:
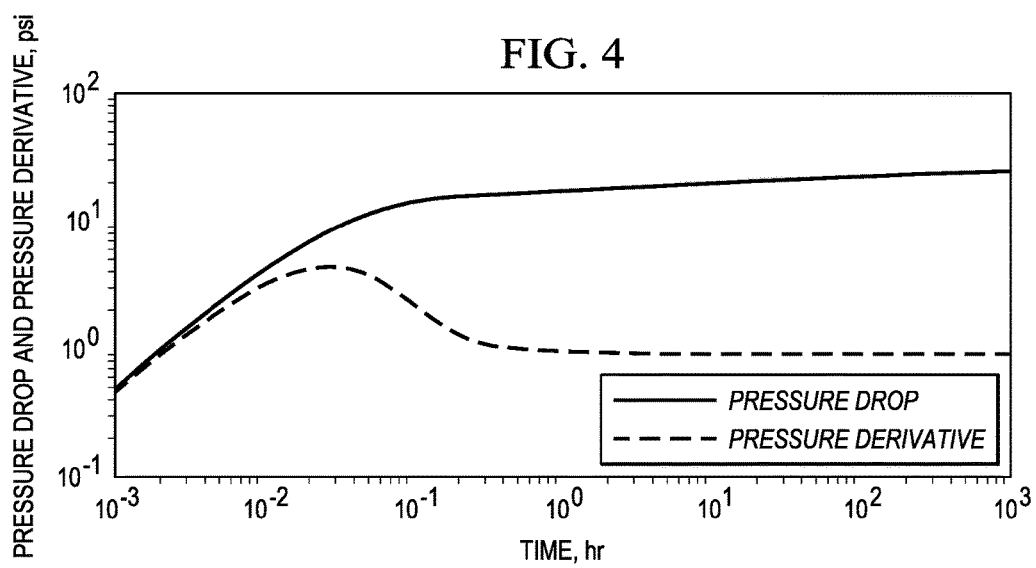
FIG. 4 is a log-log plot showing an example of the pressure drop and pressure derivative data from a producing well in the earth in with segregated flow of oil and water phases.

As indicated at step 48 and 50, once a reasonable match has been found between the model and the test data in steps 40 and 44, the determined oil flow capacity and water flow capacity and the equivalent oil phase flow capacity determined during step 40 are stored and displayed with the data processing system D (FIG. 4). The determined values of the flow capacity become characteristic parameters determined for the porous subsurface formation producing layer 14 according to the present invention.

Once a satisfactory match is achieved, individual phase flow capacity and equivalent oil phase flow capacity can be calculated using Equations (21), (22), and (23). Phase mobility can also be extracted from the flow capacity. Average saturation fractions of oil and water in the tested layers can also be estimated using Equations (19) and (20). These numbers are very important to reservoir engineers in estimating remaining oil reserves.

If the outcome of step 46 indicates that the model pressure values do not fall within an acceptable tolerance of the measured pressure values, the values of the formation flow parameters are adjusted during step 52 to seek for a better match between the model pressure values and the measured pressure values. Processing returns to step 40 for processing based on the adjusted values of formation parameters. Processing continues for further iterations until during step 46, an acceptable match between the model pressure values and the measured test values results due to a set of adjusted values of formation parameters in step 52.

Figure 3:
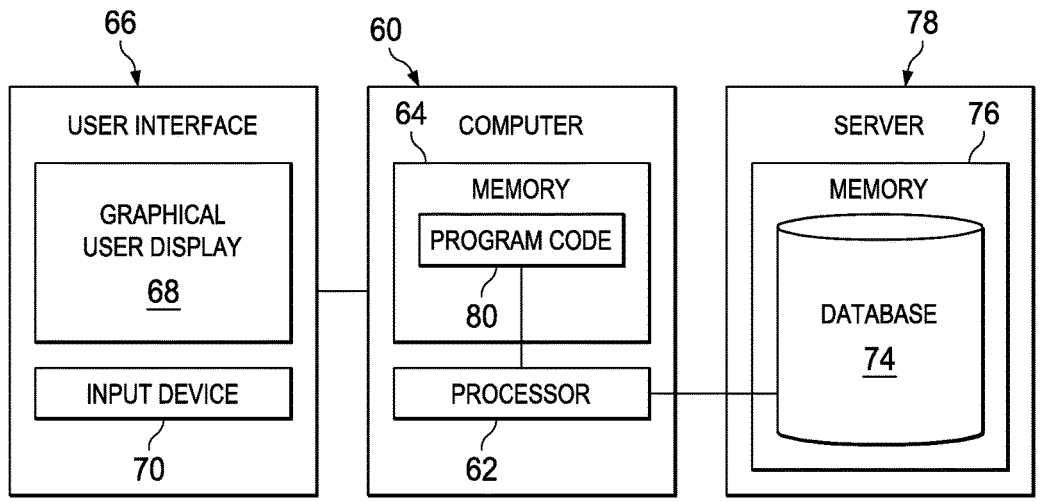
FIG. 3 is a schematic diagram of a data processing system for obtaining estimated measures of formation flow capacity and phase mobility from pressure transient data according to the present invention.

As illustrated in FIG. 3, the data processing system D includes a computer 60 having a processor 62 and memory 64 coupled to the processor 62 to store operating instructions, control information and database records therein. The data processing system D may be a multicore processor with nodes such as those from Intel Corporation or Advanced Micro Devices (AMD), an HPC Linux cluster computer or a mainframe computer of any conventional type of suitable processing capacity such as those available from International Business Machines (IBM) of Armonk, N.Y. or other source. The data processing system D may also be a computer of any conventional type of suitable processing capacity, such as a personal computer, laptop computer, or any other suitable processing apparatus. It should thus be understood that a number of commercially available data processing systems and types of computers may be used for this purpose.

The processor 62 is, however, typically in the form of a personal computer having a user interface 66 and an output display 68 for displaying output data or records of processing of measurements performed according to the present invention. The output display 68 includes components such as a printer and an output display screen capable of providing printed output information or visible displays in the form of graphs, data sheets, graphical images, data plots and the like as output records or images.

The user interface 66 of computer 60 also includes a suitable user input device or input/output control unit 70 to provide a user access to control or access information and database records and operate the computer 60.

Data processing system D further includes a database 74 stored in memory, which may be internal memory 64, or an external, networked, or non-networked memory as indicated at 76 in an associated database server 78. The database 74 also contains various data including the time and pressure data obtained during pressure transient testing of the layer under analysis, as well as the rock, fluid and geometric properties of layer 14, and the casing, annulus and other formation properties, physical constants, parameters, data measurements identified above with respect to FIG. 1 and the Nomenclature table.

The data processing system D includes program code 80 stored in a data storage device, such as memory 64 of the computer 60. The program code 80, according to the present invention is in the form of computer operable instructions causing the data processor 62 to perform the methodology of determining measures of formation flow capacity and phase mobility from pressure transient data under segregated oil and water flow conditions.

It should be noted that program code 80 may be in the form of microcode, programs, routines, or symbolic computer operable languages that provide a specific set of ordered operations that control the functioning of the data processing system D and direct its operation. The instructions of program code 80 may be stored in non-transitory memory 64 of the computer 60, or on computer diskette, magnetic tape, conventional hard disk drive, electronic read-only memory, optical storage device, or other appropriate data storage device having a computer usable medium stored thereon. Program code 80 may also be contained on a data storage device such as server 68 as a non-transitory computer readable medium, as shown.

Figure 5:
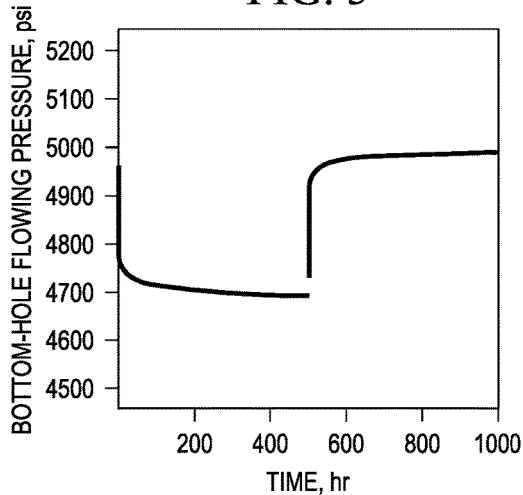
FIG. 5 an example of history plot of flowing bottom-hole pressure at a well obtained from a case study (pressure transient test) to be used for estimated measures of formation flow capacity and phase mobility according to the present invention.
Figure 6:
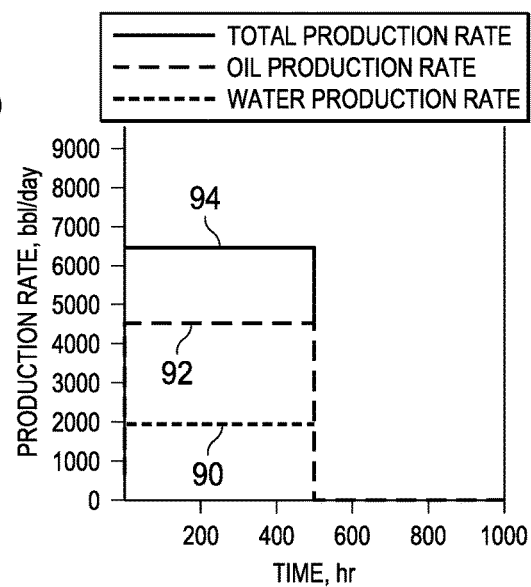
FIG. 6 is an example plot of individual oil and water phase rates and total production rate obtained from a case study (pressure transient test) forming estimated measures of formation flow capacity and phase mobility according to the present invention.
Figure 7:
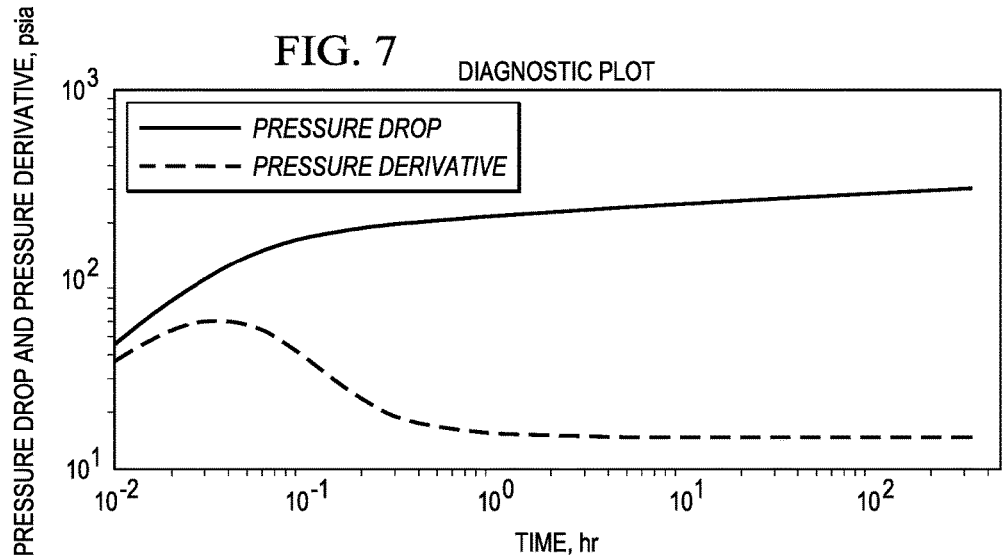
FIG. 7 is a log-log plot of pressure drop and pressure derivatives for the same case study (pressure transient test) as that of FIGS. 5 and 6.

The processor 62 of the computer 60 accesses the pressure transient testing data and other input data measurements as described above to perform the logic of the present invention, which may be executed by the processor 62 as a series of computer-executable instructions. The stored computer operable instructions cause the data processor computer 60 to determine of formation flow capacity and phase mobility from pressure transient data under segregated oil and water flow conditions in the manner described above and shown in FIG. 2. Results of such processing are then available on output display 68. The set of FIGS. 5, 6 and 7 is an example display of such result.

The inventors have observed in their numerical experiments that the present invention methodology in determining segregated flow arrives at a unique value for the phase flow capacity even with different combinations of formation flow parameters $h_o$, $h_w$, $\overline{k}_{ro}$ and $\overline{k}_{rw}$ at a fixed total flow capacity. It is to be noted that all the equations presented herein are valid for a constant total rate of production, $q_t$, while the well is producing (or during a period of drawdown). These equations can also be utilized under variable rates of production, including during buildup periods (the well is shut-in following a period of flow or drawdown) by applying the principle of superposition, which is a commonplace in the industry The present invention is thus readily applicable in cases of variable rates of production, including buildup periods.

Diagnostic Plots

Diagnostic plots such as an example shown in FIG. 4 are used repeatedly in pressure-transient well test interpretations. These provide very rigorous tools in analyzing raw data and for identifying flow regimes for estimating the key reservoir parameters. Diagnostic plots are generated by plotting pressure drop, pressure difference or pressure drawdown (initial pressure minus bottom-hole flowing pressure) and pressure derivative as a function of time on log-log scale. The segregated flow model does not provide any distinct feature in the log-log plot other than the conventional pressure derivative plot for vertical-well model.

Although built with the segregated flow model, it is to be recognized that FIG. 4 depicts a typical diagnostic plot for a vertical well model in a homogenous, infinite-acting, reservoir. However, the extended computations for extracting flow capacity and mobility with the help of the associated model make this invention worthwhile under segregated flow of oil and water in petroleum reservoirs. Once the radial flow regime is identified on a diagnostic plot (indicated by stabilization of the pressure derivative curve at later times to the level of the reservoir transmissibility line), the total flow capacity and phase mobility of the system can be determined with the present invention.

In addition, knowledge of the individual phase rates with the present invention allows for the calculation of the flow capacity of the water and oil phases, separately. The following case study is presented, of which the input parameters to the segregated flow model are listed in Table 1 below. The well has been set to produce at a constant production rate for 500 hr before shutting in the well for a period of 500 hr. The flowing bottom-hole pressure values are computed, using Equation (3), following the required inversion to the time domain using the Stehfest algorithm (1970). The principle of superposition in time has been used to compute pressure data during the shut in (buildup) period, which is a conventional practice utilized by those skilled in the art.

As no production logs have been available in this case, the individual phase rates, $q_o$ and $q_w$, have been used to calculate the zone thicknesses, $h_o$ and $h_w$, using Equations (16), (17) and (18). The values of $h_o$ and $h_w$ are 50 and 100 ft, respectively. The total downhole rate of production, $q_t$, has been estimated, from the individual oil and water rates at the standards conditions, with Equation (2) to feed the model.

TABLE 1

Parameters used in the segregated flow model

| | | | | | |
|---|---|---|---|---|---|
| $q_o$ | 2,000 STB/d | $k_{oz}, k_{wz}$ | 150 md | $\mu_o$ | 0.8 cP |
| $q_w$ | 5,000 STB/d | $\phi_{oz}, \phi_{wz}$ | 0.15 fraction | $\mu_w$ | 0.5 cP |
| Water Cut | 76% | $c_r$ | 1.00E–06 psi$^{-1}$ | C | 0.05 bbl/psi |
| $S_{wirr}$ | 0.15 fraction | $c_o$ | 1.00E–05 psi$^{-1}$ | $s_o$ | 0 dimensionless |
| $S_{orw}$ | 0.25 fraction | $c_w$ | 3.00E–06 psi$^{-1}$ | $s_w$ | 0 dimensionless |
| $\bar{k}_{ro}$ | 1 fraction | $B_o$ | 1.3 bbl/STB | $r_w$ | 0.3 ft |
| $\bar{k}_{rw}$ | 0.75 fraction | $B_w$ | 1.0 bbl/STB | $p_i$ | 5,000 psia |
| H | 150 ft | | | | |

FIG. 5 shows the calculated flowing bottom-hole pressure for the entire duration. Individual phase rates 90 for oil and 92 for water, calculated using Equations (4) and (5), are also shown in FIG. 6 along with the total production rate 94. Pressure drop and pressure derivatives are demonstrated in FIG. 7 for the buildup data. For the presented case study, oil phase flow capacity, computed using Equation (21), is 7,500 md-ft, while water phase flow capacity, computed using Equation (22), is 11,250 md-ft. The equivalent oil phase flow capacity, computed using Equation (23), is 22,500 md-ft.

The present invention provides a new methodology where segregated flow is rigorously modeled as a two-layer reservoir system, based on the observed physics. Thus, the applied mathematical model provides accurate estimates of the values of phase mobility of oil and water, in addition to the actual flow capacity of the formation. When more than one pressure-transient test is available at different water cut ratios, information about the end-point water relative permeability can be inferred. Average fluid saturations in the tested zone can also be determined with a reasonable accuracy. The present invention provides reliable reservoir characterizations and reserve estimations based on the in-situ conditions of oil and water in the reservoir.

The present invention thus provides a practical application of the underlying physics of multiphase flow under a segregated flow mechanism. The present invention provides a complete procedure to model segregated flow conditions at various reservoir, fluid properties, water cut ratios and wettability conditions.

The present invention captures the segregated flow mechanism as a two-layer reservoir system, honoring the in-situ physics. Based on petrophysical measurements (e.g., end-point relative permeability and end-point saturations), fluid properties (e.g., oil and water viscosity), and geometry of individual phase zones (e.g., oil and water zone thicknesses), an improved better description of the subsurface systems is provided, when formation oil and water fluids are flowing under segregated multiphase-flow conditions. With the present invention, the multiphase flow parameters are explicitly defined, thus offering accurate physical representation of the actual conditions in the reservoir. The methodology utilizes oil and water zone thicknesses from production-log measurements (also known as PLT in the industry), which are widely used in the oil industry. If such information is not available, it can also be inferred from other source of data such as oil and water production rates as outlined above.

The present invention provides a more sophisticated representation of the underlying physics of segregated flow of oil and water through a two-layer reservoir system. The present invention also handles fluid properties data much more accurately than the Perrine method by uniquely defining individual phase viscosity, instead of using pseudo-parameters to represent them. The Perrine approach is not flexible regarding incorporating data from the other sources, such as oil and water thicknesses from production logs, and relative permeability end-point data. These parameters are taken into account with the present invention for a better reservoir description.

The invention has been sufficiently described so that a person with average knowledge in the field of reservoir modeling and simulation may reproduce and obtain the results mentioned in the invention herein. Nonetheless, any skilled person in the field of technique, subject of the invention herein, may carry out modifications not described in the request herein, to apply these modifications to a determined structure and methodology, or in the use and practice thereof, requires the claimed matter in the following claims; such structures and processes shall be covered within the scope of the invention.

It should be noted and understood that there can be improvements and modifications made of the present invention described in detail above without departing from the spirit or scope of the invention as set forth in the accompanying claims.

What is claimed is:

1. A computer implemented method of determining a measure of oil phase flow capacity from an oil production zone in a layer of a subsurface reservoir and a measure of water phase flow capacity from a water production zone in the layer of the subsurface reservoir based on a pressure transient test of production and pressure of the layer over time, the computer implemented method comprising the steps of:
   obtaining production and pressure data for the layer over time from the pressure transient test, the production and pressure data comprising:

for each sampled instant of different sampled instants of measurement during the pressure transient test of the layer over time, a measure of well flowing pressure for the layer;

a measure of well pressure change for the layer over time during the pressure transient test of the layer; and a pressure time derivative of well pressure for the layer at the given sampled instant of measurement during the pressure transient test of the layer;

obtaining fluid properties of the layer including oil flow parameters for the oil production zone and water flow parameters for the water production zone;

obtaining rock properties and geometrics of the layer; and storing, in a database, the production and pressure data, the fluid properties of the layer, and the rock properties and geometrics of the layer; and the computer implemented method further including using a processor to perform the steps of:

(a) obtaining, from the database, the oil flow parameters for the oil production zone and the water flow parameters for the water production zone;

(b) obtaining, from the database, the measure of well flowing pressure for the layer at a given sampled instant of measurement during the pressure transient test of the layer over time;

(c) obtaining, from the database, the measure of well pressure change for the layer over time during the pressure transient test of the layer;

(d) obtaining, from the database, the pressure time derivative of well pressure for the layer at the given sampled instant of measurement during the pressure transient test of the layer;

(e) determining an estimate of oil phase flow capacity of the oil production zone of the layer;

(f) determining an estimate of water phase flow capacity of the water production zone of the layer;

(g) determining an estimate of equivalent oil phase flow capacity of the layer;

(h) generating a model wellbore flowing pressure of the layer based on the measure of well flowing pressure of the layer at the given sampled instant of measurement during the pressure transient test of the layer over time obtained from the database and the fluid properties of the layer;

(i) generating a model well pressure change of the layer, based on the measure of well pressure change of the layer over time during the pressure transient test of the layer obtained from the database and the fluid properties of the layer;

(j) generating a pressure time derivative of the model wellbore flowing pressure of the layer, based on the measure of pressure time derivative of well pressure for the layer at the given sampled time instant of measurement during the pressure transient test of the layer obtained from the database and the model wellbore flowing pressure of the layer generated;

(k) generating a model oil production rate for the oil zone of the layer based on the model wellbore flowing pressure of the layer generated and the oil flow parameters for the oil production zone;

(l) generating a model water production rate for the water zone of the layer, based on the model wellbore flowing pressure of the layer generated and the water flow parameters for the water production zone;

(m) displaying, via an output display, the model wellbore flowing pressure of the layer generated, the model well pressure change of the layer generated, the pressure time derivative of the model wellbore flowing pressure of the layer generated, the measure of well flowing pressure for the layer at the given sampled instant of measurement during the pressure transient test of the layer over time obtained from the database, the measure of well pressure change for the layer over time during the pressure transient test of the layer obtained from the database, and the pressure time derivative of well pressure for the layer at the given sampled instant of measurement during the pressure transient test of the layer obtained from the database for:

comparing the model wellbore flowing pressure of the layer generated with the measure of well flowing pressure for the layer at the given sampled instant of measurement during the pressure transient test of the layer over time obtained from the database;

comparing the model measure of well pressure change of the layer generated with the measure of well pressure change for the layer over time during the pressure transient test of the layer obtained from the database; and comparing the model pressure derivative of the model wellbore flowing pressure of the layer generated with the pressure derivative of well pressure for the layer at the given sampled instant of measurement during the pressure transient test of the layer; and (n) receiving an indication of a match or a non-match, the match being indicative of the following conditions being satisfied, and the non-match being indicative of one or more of the following conditions not being satisfied:

(i) the model wellbore flowing pressure of the layer generated matches the measure of well flowing pressure for the layer at the given sampled instant of measurement during the pressure transient test of the layer over time obtained from the database;

(ii) the model measure of well pressure change of the layer generated matches the measure of well pressure change for the layer over time during the pressure transient test of the layer obtained from the database; and (iii) the model pressure derivative of the model wellbore flowing pressure of the layer generated matches the pressure derivative of well pressure for the layer at the given sampled instant of measurement during the pressure transient test of the layer, (o) in response to receiving an indication of a match, storing, in the database, the model oil production rate for the oil zone of the layer generated and the model water production rate for the water zone of the layer generated; and (p) in response to receiving an indication of a non-match:

adjusting values of the oil flow parameters for the oil production zone to generate adjusted oil flow parameters for the oil production zone and adjusting the water flow parameters for the water production zone of the layer to generate adjusted water flow parameters for the water production zone, and repeating steps (h) to (n) using the adjusted oil flow parameters for the oil production zone in place of the oil flow parameters for the oil production zone and using the adjusted water flow parameters for the water production zone in place of the water flow parameters for the water production zone, in response to receiving an indication of a match at step (n) based on the adjusted oil flow parameters for the oil production zone and the adjusted water flow parameters for the water production zone, storing, in the database, the following:

the adjusted oil flow parameters for the oil production zone;

the adjusted water flow parameters for the water production zone;

the model oil production rate for the oil zone of the layer generated based on the adjusted oil flow parameters for the oil production zone and the adjusted water flow parameters for the water production zone; and the model water production rate for the water zone of the layer generated based on the adjusted oil flow parameters for the oil production zone and the adjusted water flow parameters for the water production zone.

2. The computer implemented method of claim 1, further including using the processor to perform the step of displaying, via the output display, the oil flow parameters for the oil production zone and the water flow parameters for the water production zone of the layer.

3. The computer implemented method of claim 1, further including using the processor to perform the step of displaying, via the output display, the model oil production rate for the oil production zone of the layer generated.

4. The computer implemented method of claim 1, further including using the processor to performing the step of displaying, via the output display, the model water production rate for the water production zone of the layer generated.

5. The computer implemented method of claim 1, further including the steps of:

forming measures of estimated oil phase flow capacity for the oil production zone, water phase flow capacity for the water production zone and equivalent oil phase flow capacity of the layer.

6. The computer implemented method of claim 5, further including using the processor to perform the step of displaying, via the output display, the measures of the estimated oil phase flow capacity for the oil production zone, water phase flow capacity for the water production zone and equivalent oil phase flow capacity of the layer.

7. The computer implemented method of claim 1, further including using the processor to perform the step of displaying, via the output display, the adjusted oil flow parameters for the oil production zone and the water flow parameters for the water production zone of the layer.

8. The computer implemented method of claim 1, further including using the processor to perform the step of storing the model wellbore flowing pressure of the layer generated, the model wellbore pressure change of the layer generated, and the model pressure derivative of the model wellbore flowing pressure of the layer generated.

9. The computer implemented method of claim 8, further including using the processor to perform the step of displaying, via the output display, model wellbore flowing pressure of the layer generated, the model wellbore pressure change of the layer generated, and the model pressure derivative of the model wellbore flowing pressure of the layer generated.

10. The computer implemented method of claim 1, wherein the pressure transient test is performed during well drawdown.

11. The computer implemented method of claim 1, wherein the pressure transient test is performed during well buildup.

* * * * *

UNITED STATES PATENT AND TRADEMARK OFFICE
CERTIFICATE OF CORRECTION

PATENT NO. : 10,435,996 B2  
APPLICATION NO. : 16/129501  
DATED : October 8, 2019  
INVENTOR(S) : Nooruddin et al.

Page 1 of 1

It is certified that error appears in the above-identified patent and that said Letters Patent is hereby corrected as shown below:

In Column 19, Claim 4, Line 29 should read:
    -- including using the processor to perform the step of --

Signed and Sealed this  
Nineteenth Day of November, 2019

Andrei Iancu  
*Director of the United States Patent and Trademark Office*